(12) United States Patent
Battiato et al.

(10) Patent No.: US 7,800,173 B2
(45) Date of Patent: Sep. 21, 2010

(54) MANUFACTURING PROCESS OF A VERTICAL-CONDUCTION MISFET DEVICE WITH GATE DIELECTRIC STRUCTURE HAVING DIFFERENTIATED THICKNESS AND VERTICAL-CONDUCTION MISFET DEVICE THUS MANUFACTURE

(75) Inventors: Orazio Battiato, Gravina di Catania (IT); Domenico Repici, Rometta Marea (IT); Fabrizio Marco Di Paola, Catania (IT); Giuseppe Arena, Catania (IT); Angelo Magri', Belpasso (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 229 days.

(21) Appl. No.: 12/074,226

(22) Filed: Feb. 29, 2008

(65) Prior Publication Data
US 2008/0211021 A1     Sep. 4, 2008

(30) Foreign Application Priority Data
Mar. 2, 2007     (IT)     ............... TO07A0163

(51) Int. Cl.
*H01L 29/76*     (2006.01)

(52) U.S. Cl. ........................ 257/335; 257/328; 257/346; 257/411; 257/E29.256; 257/E21.417; 438/289; 438/217; 438/276; 438/287

(58) Field of Classification Search ................. 257/335, 257/328, 346, 411, E29.256, E21.417; 438/289, 438/217, 276, 287
See application file for complete search history.

(56) References Cited

U.S. PATENT DOCUMENTS 4,376,286 A     3/1983     Lidov et al.

(Continued)

FOREIGN PATENT DOCUMENTS

EP     0 586 835 A1     3/1994

(Continued)

OTHER PUBLICATIONS

U.S. Appl. No. 11/919,570, Giuseppe Curro'.

(Continued)

*Primary Examiner*—Tu-Tu V Ho
(74) *Attorney, Agent, or Firm*—Lisa K. Jorgenson; Kevin D. Jablonski; Graybeal Jackson LLP

(57) ABSTRACT

According to an embodiment of a method for manufacturing a MISFET device, in a semiconductor wafer, a semiconductor layer is formed, having a first type of conductivity and a first level of doping. A first body region and a second body region, having a second type of conductivity, opposite to the first type of conductivity, and an enriched region, extending between the first and second body regions are formed in the semiconductor layer. The enriched region has the first type of conductivity and a second level of doping, higher than the first level of doping. Moreover, a gate electrode is formed over the enriched region and over part of the first and second body regions, and a dielectric gate structure is formed between the gate electrode and the semiconductor layer, the dielectric gate structure having a larger thickness on the enriched region and a smaller thickness on the first and second body regions. To form the enriched region, a first conductive layer is made on the semiconductor layer, an enrichment opening is formed in the first conductive layer, and a dopant species is introduced into the semiconductor layer through the enrichment opening. Furthermore, the formation of the dielectric gate structure envisages filling the enrichment opening with dielectric material, prior to forming the first body region and the second body region.

28 Claims, 8 Drawing Sheets

U.S. PATENT DOCUMENTS

| | | | |
|---|---|---|---|
| 4,974,059 A | 11/1990 | Kinzer | |
| 6,362,036 B1 | 3/2002 | Chiozzi et al. | |
| 6,992,353 B1* | 1/2006 | Wu | 257/335 |
| 7,067,363 B2 | 6/2006 | Magri' et al. | |
| 2003/0057478 A1* | 3/2003 | Yun et al. | 257/328 |
| 2004/0164346 A1* | 8/2004 | Venkatraman | 257/328 |
| 2007/0064362 A1* | 3/2007 | Migliavacca | 361/82 |

FOREIGN PATENT DOCUMENTS

| | | |
|---|---|---|
| EP | 0 747 968 A1 | 12/1996 |
| EP | 1 313 147 A2 | 5/2003 |
| EP | 1 455 397 A2 | 9/2004 |
| JP | 05299658 | 11/1993 |
| JP | 07221296 | 8/1995 |
| JP | 09102506 | 4/1997 |
| JP | 10335643 | 12/1998 |
| WO | WO 2006/114376 A1 | 11/2006 |

OTHER PUBLICATIONS

International Search Report, European Patent Office, PCT/EP2006/061664, Jul. 17, 2006 (pp. 11).

European Search Report, European Patent Office, EP 05 42 5260, Feb. 20, 2006, (pp. 11).

* cited by examiner

MANUFACTURING PROCESS OF A VERTICAL-CONDUCTION MISFET DEVICE WITH GATE DIELECTRIC STRUCTURE HAVING DIFFERENTIATED THICKNESS AND VERTICAL-CONDUCTION MISFET DEVICE THUS MANUFACTURE

PRIORITY CLAIM

This application claims priority from Italian patent application No. TO2007A 000163, filed Mar. 2, 2007, which is incorporated herein by reference.

TECHNICAL FIELD

An embodiment of the present invention relates to a process for manufacturing a vertical-conduction MISFET device having a gate dielectric structure with differentiated thickness, and to a vertical-conduction MISFET device thus obtained.

BACKGROUND

As is known, the performance of power vertical-conduction MISFET devices (or more simply vertical MISFETs), in particular, vertical-current-flow DMOS transistors (VDMOS devices), may be affected by the presence of parasitic components, which may produce variable effects according to the operating conditions. For example, VDMOS devices may comprise body regions, having a conductivity, housed at a short distance from one another in an epitaxial layer having opposite conductivity. Adjacent body regions and the portion of the epitaxial layer comprised therebetween consequently define a parasitic JFET, which is activated when the VDMOS device is conducting.

Besides depending upon the operating conditions and the level of doping of the epitaxial layer, the resistance of the parasitic JFET may depend basically upon its channel width, i.e., upon the distance between the body regions. In practice, the greater the distance between the body regions, the lower the resistance of the JFET, and vice versa. On the other hand, overlying the portion of epitaxial layer forming the channel of the JFET are gate electrodes, normally made of polysilicon, which are insulated only through e.g., a gate-oxide layer, and remain capacitively coupled. The effect of the capacitive coupling, however, increases as the distance between the body regions increases, unlike the resistance of the parasitic JFET. Consequently, it may not be possible to act on this distance to reduce the resistance of the parasitic JFET, without penalizing the dynamic characteristics of the VDMOS device. Furthermore, the increase of the distance between the body regions may also be in conflict with the need to reduce the dimensions of the devices, which has acquired an increasingly greater importance in modern microelectronics.

Different measures have been proposed to overcome the above drawbacks.

A first measure envisages an enrichment implant to increase the doping in a surface layer of the wafer housing the VDMOS device so as to increase the conductivity. Alternatively, the enrichment may be obtained by epitaxially growing a layer having an appropriate doping level. In some cases, however, and especially for low-voltage devices, the maximum doping of the body regions differs only a little from the doping of the epitaxial layer. The surface enrichment that extends throughout the entire wafer may thus interfere significantly with the threshold voltage and the length of the VDMOS channel (which extends in the proximity of the surface of the body regions) up to the point where functionality of the device is jeopardized (premature punch-through). For this reason, the surface enrichment is normally selectively performed, for example with masked implants, and confined to portions of the epitaxial layer comprised between the body regions and arranged at a slight distance from the latter.

A further measure to improve the dynamic performance regards the use of gate-oxide layers with differentiated thicknesses. More precisely, localized growths of oxide are performed, normally by LOCOS technique, above the areas forming the channel of the parasitic JFET, which may possibly be enriched. The LOCOS technique, however, is rather imprecise, because of the characteristic "birdbeaks" that insinuate laterally in a way that may be only roughly foreseen. The reduction in the dimensions may not, therefore, be pushed beyond a still somewhat unsatisfactory limit.

Other techniques envisage the deposition of oxide instead of using the LOCOS growth technique. Also in this case, however, there may be limits that prevent a significant reduction in the dimensions from being achieved. In particular, parts of the wafer are freed from the deposited oxide, which instead remains above the parasitic JFETs. For this purpose, the oxide is deposited on a previously shaped polysilicon layer, which defines gate electrodes and, moreover, functions as a mask. The areas that are to remain covered by the oxide are located under first openings of the mask, which have dimensions such as to be completely filled on account of the fact that the oxide is conformally deposited also on the vertical walls, thus increasing in thickness in a horizontal direction. The areas where the oxide is to be completely removed are located, instead, under second openings of the mask, which have dimensions such as not to be filled completely. The oxide is then etched to remove a controlled thickness in such a way as to free the second openings, but not the first openings. The second openings, therefore, have dimensions in a pre-determined ratio with the first openings or larger, because otherwise they not could be freed of the oxide. This constraint may limit the density of integration that can be obtained.

Furthermore, the polysilicon layer used as mask also forms the gate electrode, but is interrupted by the first and second openings. Consequently, the resistance offered by the gate electrode may not be optimal.

SUMMARY

An embodiment of the present invention is a process for manufacturing a vertical MISFET device and a vertical MISFET device that enables a reduction in the parasitic resistance and in the dimensions to be obtained, without jeopardizing the dynamic performance.

BRIEF DESCRIPTION OF THE DRAWINGS

One or more embodiments of the invention will now be described, purely by way of non-limiting example and with reference to the attached drawings, wherein.

DETAILED DESCRIPTION

Figure 1:
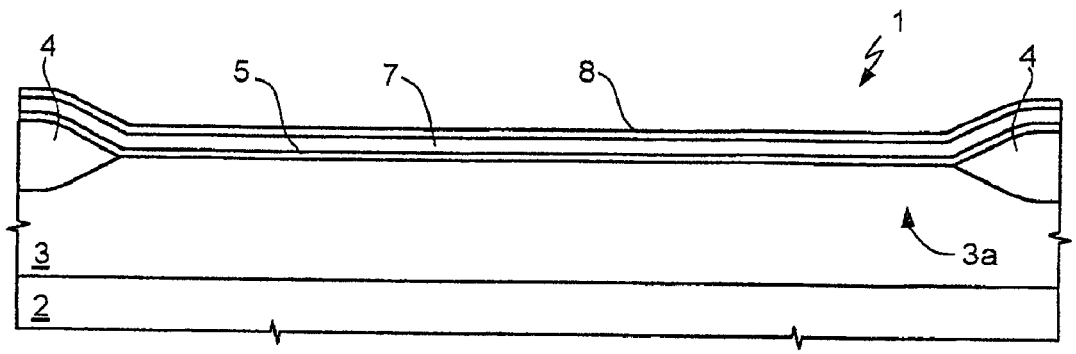
FIGS. 1-13 show cross sections through a semiconductor wafer in successive steps of a process for manufacturing a MISFET device in accordance with a first embodiment of the present invention.

FIG. 1 shows a wafer 1 made of semiconductor material in an initial step of a process for manufacturing a vertical-conduction MISFET ("Metal-Insulator-Silicon FET") device (or vertical MISFET), in particular a vertical DMOS (VDMOS) transistor, according to an embodiment of the invention. This must not, however, be considered in any way limiting, in so far as it is also possible to make vertical MISFET devices of other types, such as, for example, IGBTs.

The wafer 1 comprises a substrate 2, which is heavily doped (for example with an $N^+$ doping), and a semiconductor layer, which is less heavily doped (in the example, with an N doping), for example, grown epitaxially on the substrate 2 (epitaxial layer 3).

After formation of edge-termination structures and execution of steps of pre-cleaning in themselves known and hence not described in detail, field-oxide regions 4 are formed for delimiting active areas in the epitaxial layer 3. Then, a thin dielectric gate layer 5 is formed having, for example, a thickness comprised between approximately 10 nm and 150 nm. The dielectric gate layer 5 may be formed via a thermal oxidation, or else via the deposition of a layer of oxynitride or a multilayer constituted by the superposition of successive layers of oxide and nitride.

A first polysilicon layer 7 is deposited on the dielectric gate layer 5, for a thickness comprised between approximately 100 nm and 500 nm. The polysilicon layer 7 may be intrinsic and doped subsequently by ion implantation, or, possibly, already doped in the step of deposition.

The first polysilicon layer 7 is then coated with a sacrificial layer 8, subsequently to be used as stopper layer for operations of planarization. In an embodiment described herein, the sacrificial layer 8 is made of silicon nitride and has a thickness comprised between approximately 10 nm and 100 nm. According to an alternative embodiment, the sacrificial layer 8 is omitted.

The structure of FIG. 1 is thus obtained.

Figure 2:
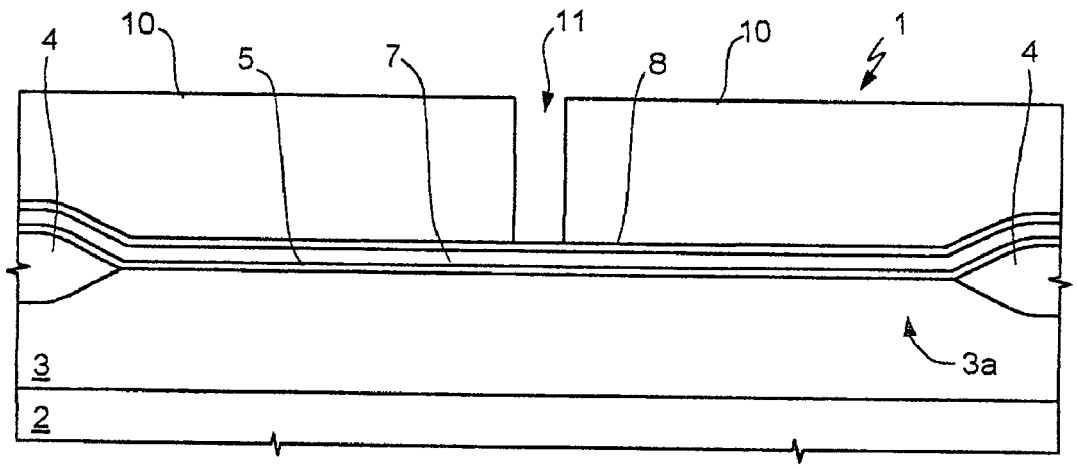

Then (FIG. 2), a resist layer is deposited in which, by a photolithographic process, an enrichment mask 10 is defined, having a window 11. The opening is located on a portion of the epitaxial layer 3 that will be subsequently enriched by implantation of dopant species and that is to form a conductive path between body regions of the VDMOS device being produced (more precisely, it forms the channel of the parasitic JFET of the VDMOS device).

Figure 3:
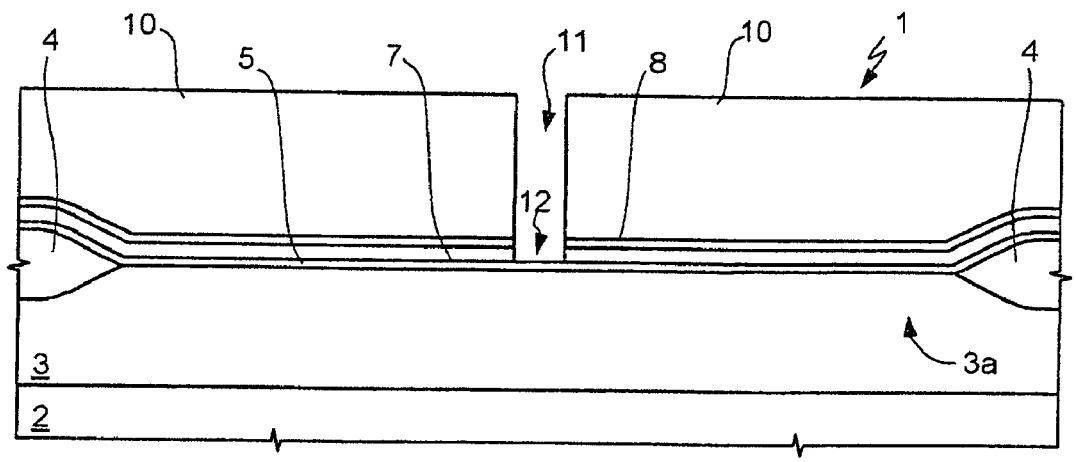

The enrichment mask 10 is used for selectively etching the sacrificial layer 8 and the first polysilicon layer 7, as illustrated in FIG. 3, so as to form at least one enrichment opening 12. In an embodiment described herein, the etch, which is markedly anisotropic (vertical), is a plasma etch with end-point in the dielectric gate layer 5.

Figure 4:
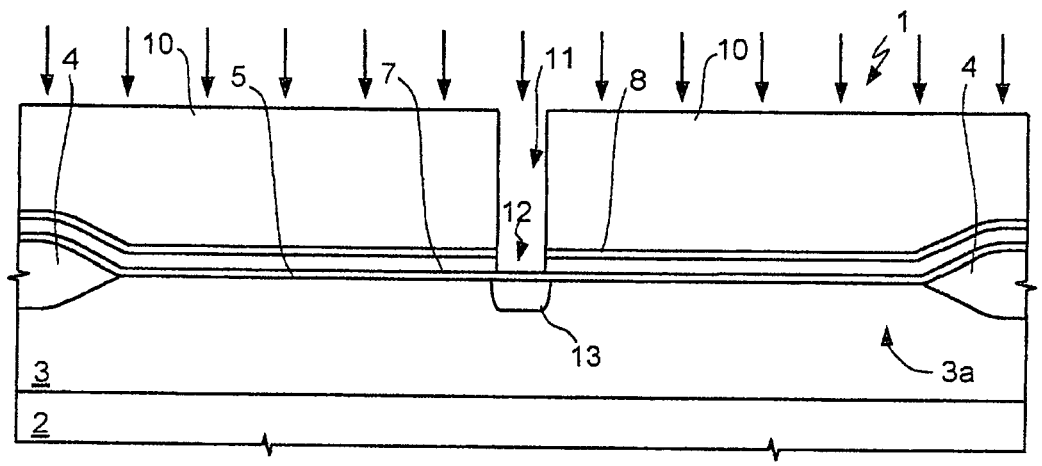

Next (FIG. 4), an enrichment implant is carried out, exploiting again the enrichment mask 10, to form an enriched region 13 through the window 11. In an embodiment described herein, where an N-channel device is formed, the enriched region is of an N type and is formed using dopants, such as phosphorus or arsenic, with a density comprised between approximately $10^{12}$ atoms/cm$^3$ and $10^{14}$ atoms/cm$^3$. The implantation energy, moreover, is such that the dopant species is confined within a depth of body regions that will subsequently be formed. For example, the final depth of the enriched region 13 is comprised between approximately 0.1 μm and 1 μm. In the case of a P-channel device, dopants may be implanted, such as boron or aluminium, substantially with the same concentrations as those indicated above.

Figure 5:
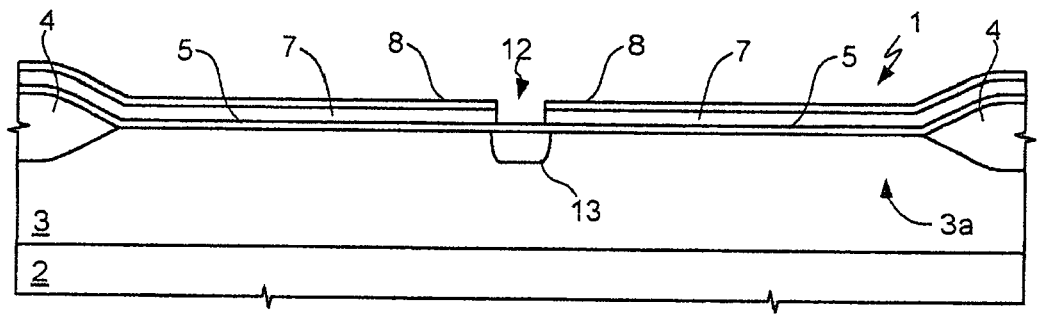

The enrichment mask 10 is then removed (FIG. 5), and an annealing step is performed for annealing the surface damage possibly caused during etching or the enrichment implantation. During annealing, the vertical walls of the opening 12 may be oxidized, and the thickness of the dielectric gate layer 5 may grow slightly where exposed, in particular if the most superficial portion of the dielectric gate layer 5 itself is made of silicon oxide. For reasons of simplicity, the possible increase in thickness is not illustrated in the FIGS.

Figure 6:
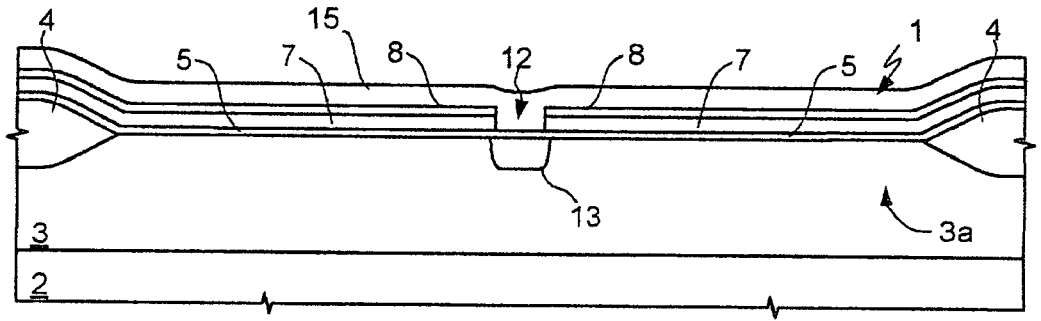

Then, a dielectric filling layer 15 is formed, having a thickness such as to fill the enrichment opening 12 completely, as illustrated in FIG. 6. In an embodiment described herein, the dielectric filling layer 15 is deposited by CVD (Chemical Vapor Deposition) and is, for example, made of silicon oxide or silicon nitride.

Figure 7:
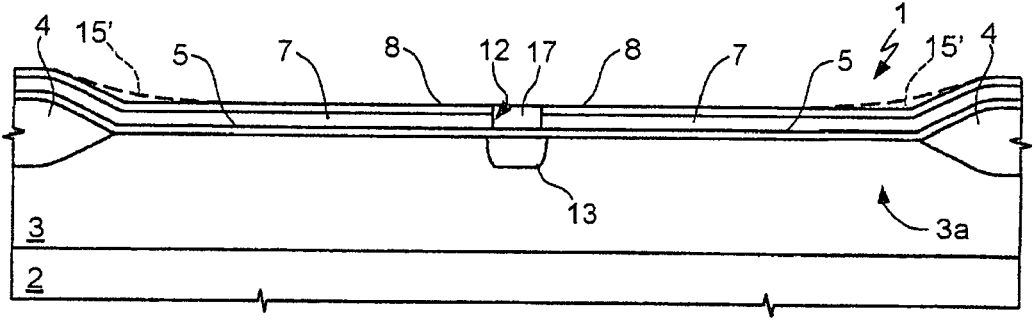

With reference to FIG. 7, the wafer 1 is planarized by CMP (Chemical Mechanical Planarization), for removing the portion of the dielectric filling layer 15 that exceeds the enrichment opening 12. The planarization is stopped when the sacrificial layer 8, which is used as stopper layer for end-point reading, is reached. In this way, the control of the process is reliable, and it is possible to preserve the first polysilicon layer 7.

In another different embodiment, the planarization is performed by dry plasma etch (for example, using an Ar, $CF_4$, $CHF_3$, and CO-based plasma). Also in this case, the sacrificial layer 8 is used as stopper layer.

In this step, the dielectric filling layer 15 is removed everywhere other than in the enrichment opening 12, where it forms a thick dielectric gate region 17.

Any possible residue 15' of the dielectric filling layer 15 (generally at the margins of the active area, on account of the surface irregularities due to the shapes of the field-oxide regions 4, and indicated by a dashed line in FIG. 7) may be eliminated by wet etch in a diluted solution of HF.

Figure 8:
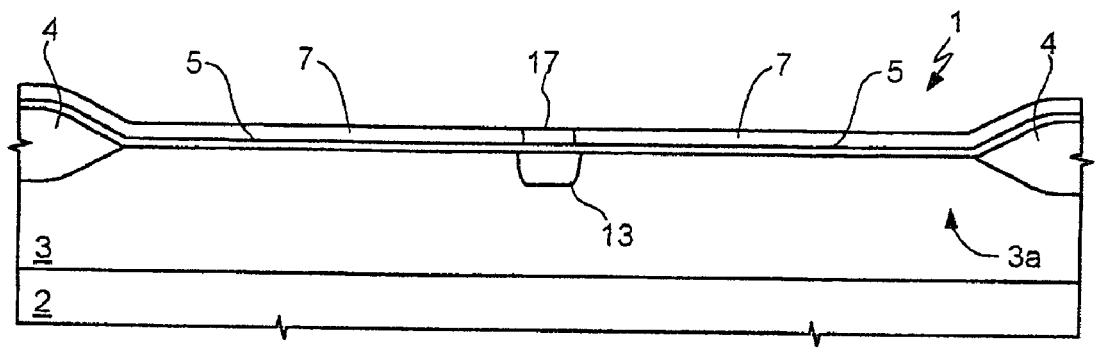

Subsequently (FIG. 8), the sacrificial layer 8 is removed with a further wet etch, for example, using a solution of $H_3PO_4$. At this point, the first polysilicon layer 7 is again exposed. The thick dielectric gate region 17 separates the two portions of the first polysilicon layer 7 from one another.

Figure 9:
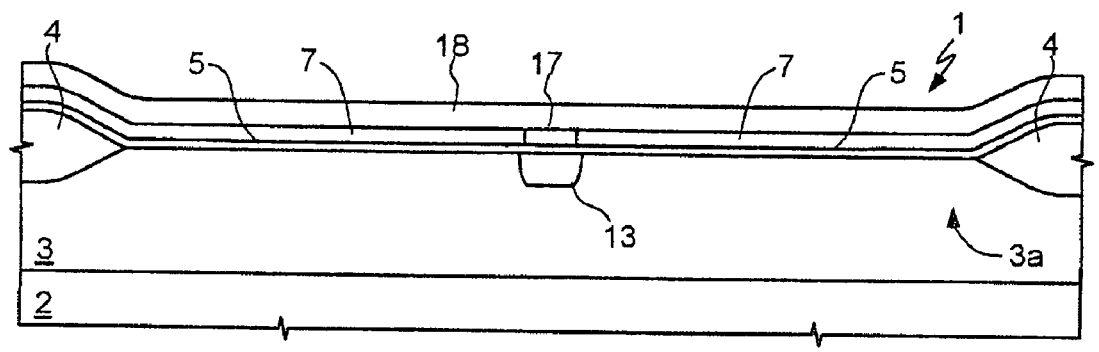

A second polysilicon layer 18 is then deposited, directly in contact with the first polysilicon layer 7 (FIG. 9). The second polysilicon layer 18 has a thickness such as to completely coat the thick dielectric gate region 17 and forms a bridge between the portions of the first polysilicon layer 7, connecting them electrically. Consequently, the thick dielectric gate region 17 at the bottom is in contact with the dielectric gate layer 5 and on the remaining sides is surrounded by polysilicon.

Figure 10:
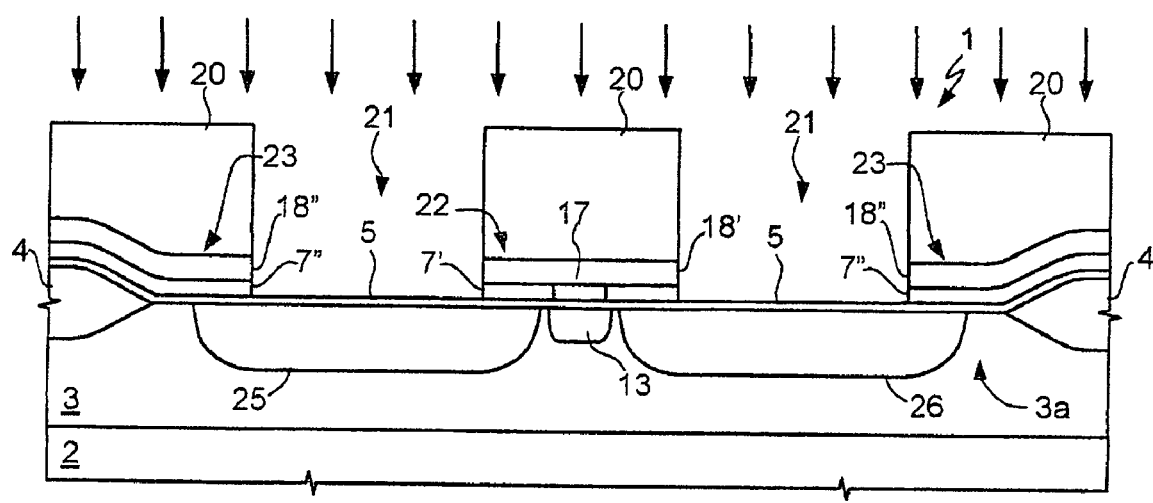

A gate mask 20 is then formed (FIG. 10), which protects the wafer 1 around the enriched region 13 and in the proximity of the field-oxide regions 4, and has body windows 21 at the side of the enriched region 13.

The first polysilicon layer 7 and the second polysilicon layer 18 are shaped using the gate mask 20, for forming at least one first gate electrode 22 and second gate electrodes 23. In greater detail, the first gate electrode 22, which comprises respective portions 7, 18' of the first polysilicon layer 7 and of the second polysilicon layer 18, is arranged on the enriched region 13 and extends laterally for a stretch on both sides of the latter. In particular (see also FIG. 13a, which shows an enlarged portion of the wafer 1 at the end of the manufacturing process), the first gate electrode 22 has a first thickness D, that is smaller above the thick dielectric gate region 17 and a second thickness $D_2$ that is larger outside of the thick dielectric gate region 17. Consequently, the thick dielectric gate region 17 is incorporated in the first gate electrode 22. The second gate electrodes 23 comprise respective portions 7', 18" of the first polysilicon layer 7 and of the second polysilicon layer 18, are located at the edges of the active area 3a, and in part overlap the field-oxide regions 4.

Using again the gate mask 20, a body implant is then performed, followed by a first thermal-diffusion process, to provide at least a first body region 25 and a second body region 26, both of a P type. Thanks to the thermal-diffusion process, the first body region 25 and the second body region 26 extend also underneath the first gate electrode 22 and the second gate electrodes 23, in particular, as far as into the proximity of the enriched region 13. The body regions 25, 26 are electrically coupled to one another in a known way, by a connection not illustrated herein.

Figure 11:
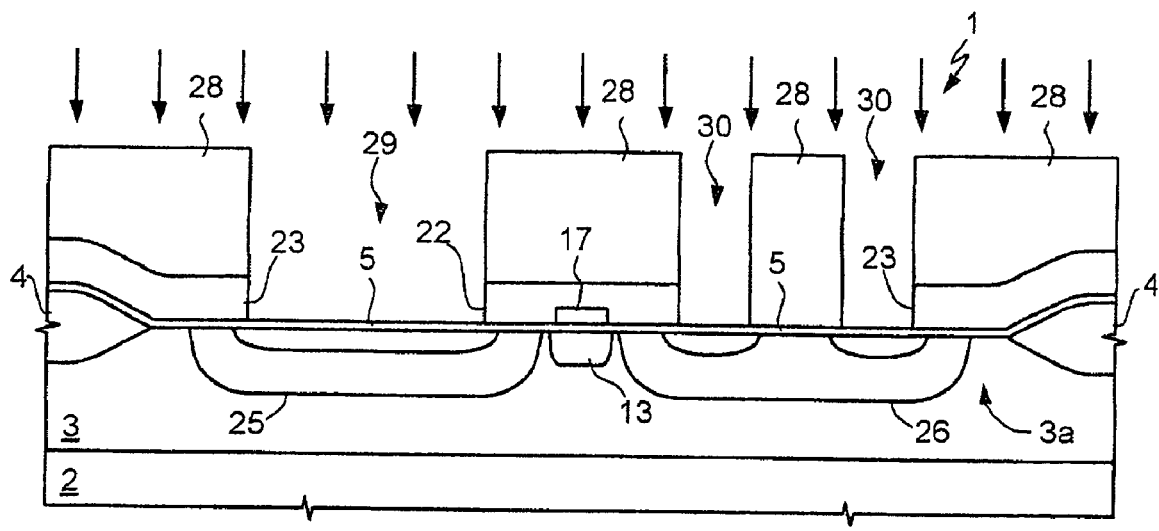

After the body implant and the first diffusion process, the gate mask 20 is removed, and a source mask 28 is formed, as illustrated in FIG. 11. For example, the source mask 28 has a first window 29, on the first body region 25 and aligned to the first gate electrode 22 and to the corresponding second gate electrode 23 (for reasons of simplicity, hereinafter the first gate electrode 22 and the second gate electrodes 23 are illustrated in the FIGS. as being formed by a single layer, and the distinction between residual portions of the first polysilicon layer 7 and of the second polysilicon layer 18 is no longer indicated).

Furthermore, the source mask 28 has two second windows 30, which uncover respective portions of the second body region 26 and are aligned, respectively, to the first gate electrode 22 and to the second gate electrode 23 that coats part of the second body region 26.

A source implant is then performed, followed by a second thermal-diffusion process. In this step, dopants of an N type are introduced into the wafer 1 through the source mask 28 and made to diffuse to provide a first source region 32, housed in the first body region 25, and two second source regions 33, both housed in the second body region 26.

Figure 12:
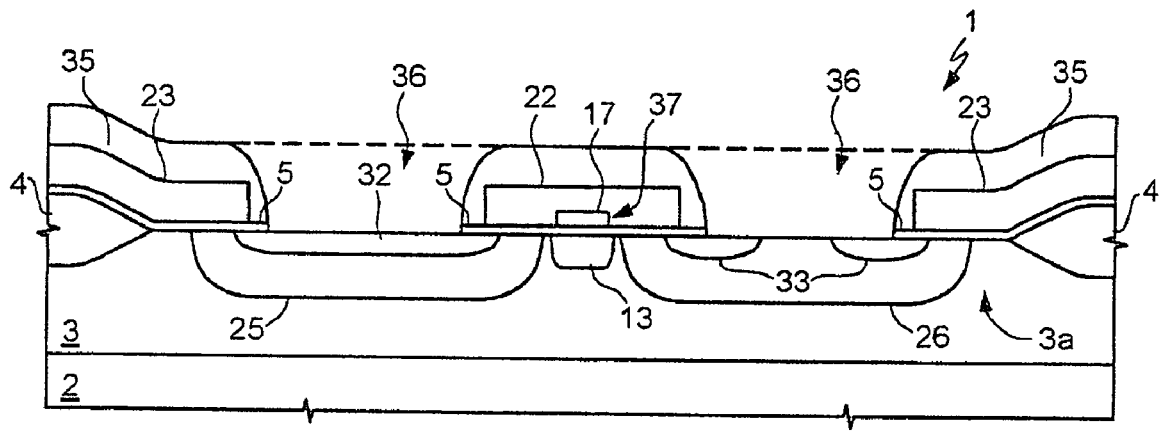

The source mask 28 is then removed, and an insulating layer 35 (illustrated in part with a dashed line in FIG. 12) is deposited. The insulating layer 35 is, for example, made of silicon oxide and has a thickness such as to incorporate the first gate electrode 22 and the second gate electrodes 23. Using a purposely provided mask, not illustrated herein, the insulating layer 35 and the dielectric gate layer 5 are etched to form source windows 36, which partially uncover the first source region 32 and the second source regions 33, as well as part of the second body region 26. After removing part of the dielectric gate layer 5, a dielectric gate structure 37 is defined, which separates the first gate electrode 22 from the underlying epitaxial layer 3, in particular from the enriched region 13, the body regions 25, 26, the first source region 32, and the adjacent second source region 33. In greater detail, the dielectric gate structure 37 comprises a portion of the dielectric gate layer 5, which extends from the first source region 32 to the second source region 33 closer to the enriched region 13, and the thick dielectric gate region 17, which is located substantially on the enriched region 13. The dielectric gate structure 37 thus has a differentiated thickness (see also FIG. 13a): a first part, which is thinner, has in fact the thickness $D_3$ of just the dielectric gate layer 5, while a second part, arranged between the first body region 25 and the second body region 26, on the enriched region 13, comprises also the thick dielectric gate region 17 and has a greater thickness $D_4$. Also the first gate electrode 22 has a differentiated thickness, in a way complementary to the dielectric gate structure 37: the first gate electrode 22 has in fact a larger thickness where the dielectric gate structure 37 is thinner and, instead, a smaller thickness where the dielectric gate structure 37 is thicker.

Figure 13:
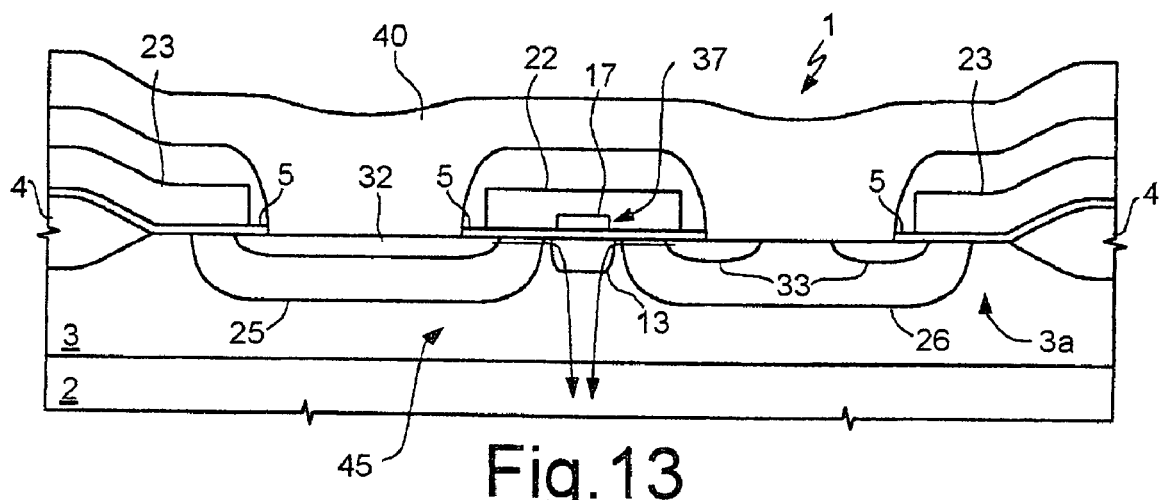
Figure 13A:
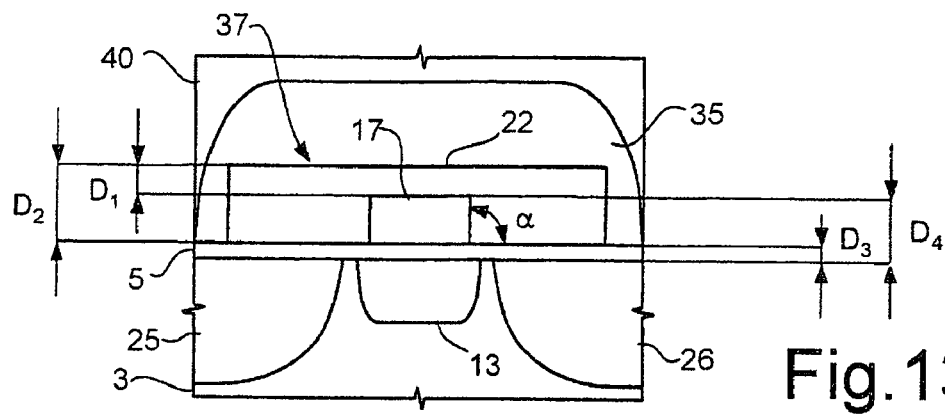
FIG. 13a shows an enlarged detail of FIG. 13.
Figure 14:
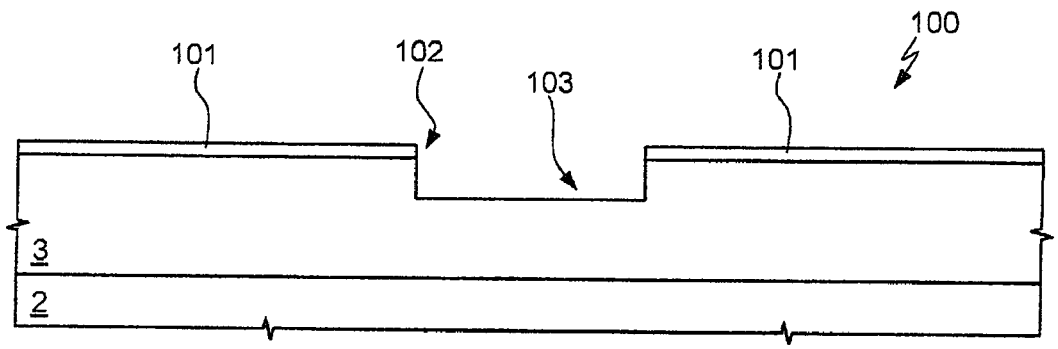
FIGS. 14 and 15 show cross sections through a semiconductor wafer in successive steps of a process for manufacturing a MISFET device in accordance with a second embodiment of the present invention.
Figure 15:
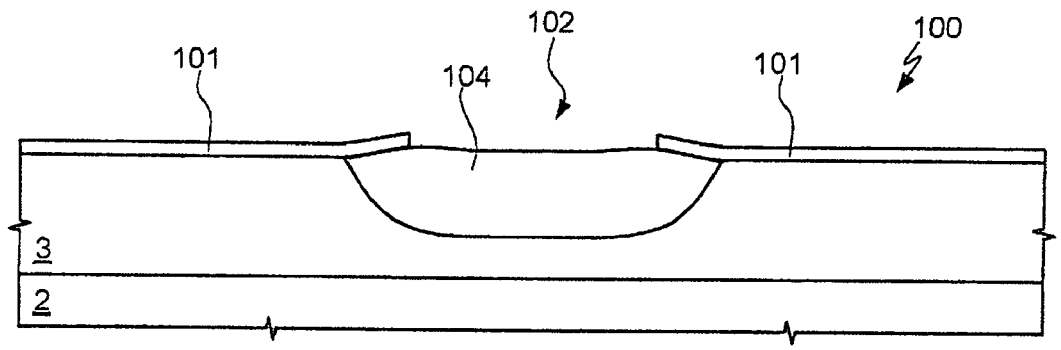

The manufacturing process is then completed with metallization steps, in which source contacts 40 are made, as well as gate and drain contacts, not illustrated herein. A VDMOS transistor 45 is thus obtained, the structure of which is illustrated in FIG. 13. FIG. 13a shows in greater detail: the enriched region 13; the thicknesses $D_1$, $D_2$ of the gate electrode 22, respectively above the dielectric gate structure 37 and outside it; and the thicknesses $D_3$, $D_4$ of the dielectric gate structure 37, respectively above the body regions 25, 26 and on the enriched region 13. Furthermore, FIG. 13a shows an angle a formed by walls of the thick dielectric gate region 17 with a surface parallel to the surface 3b of the epitaxial layer 3 (outside the thick dielectric gate region 17). The angle α may be greater than 70°, for example, greater than 80°.

The VDMOS transistor 45 includes a parasitic JFET, defined by the enriched region 13 and by the body regions 25, 26. When the VDMOS transistor 45 is active, a current flows from the source regions 32, 33 to the substrate 2, which forms a drain terminal, traversing channel regions (defined by surface portions of the body regions 25, 26), the enriched region 13, and part of the epitaxial layer 3. The parasitic JFET hence conducts. Its resistance, however, is low because the enriched region 13, which is heavily doped, has high conductivity and moreover is only negligibly affected by the modulation effect of the body regions 25, 26. Furthermore, the enriched region 13 is substantially decoupled from the first gate electrode 22, because the dielectric gate structure 37 is thick between them. In practice, then, the structure of the VDMOS transistor 45 enables abatement of the resistance of the parasitic JFET, without sacrificing either the dimensions or the dynamic performance.

The manufacturing process is thus simple and, in particular, the steps of production of the enriched region 13 and of the thick dielectric gate region 17 are self-aligned and consequently, may be extremely controllable and precise.

It may be convenient to make the thick dielectric gate region 17 with practically vertical walls (with a slope in any case greater than 70°). This contributes to minimizing the dimensions of the VDMOS transistor 45, without jeopardizing decoupling of the enriched region 13 and of the first gate electrode 22.

According to another embodiment of the invention, illustrated in FIGS. 14-18, where parts that have already been illustrated are designated by the same reference numbers, at the start of the manufacturing process recessed field-oxide regions are formed. In this case, on a wafer 100 of semiconductor material, comprising the substrate 2 and the epitaxial layer 3, a hard mask 101 is formed, having windows 102. The epitaxial layer 3 is etched anisotropically through the hard mask 101, to open up trenches 103. Next (FIG. 15), a thermal oxidation is performed, in which recessed field-oxide regions 104 are formed in the trenches 103. In practice, the recessed field-oxide regions 104 fill the trenches 103, but project from the surface of the epitaxial layer 3 only marginally, without involving significantly the planarity of the wafer 100.

Figure 16:
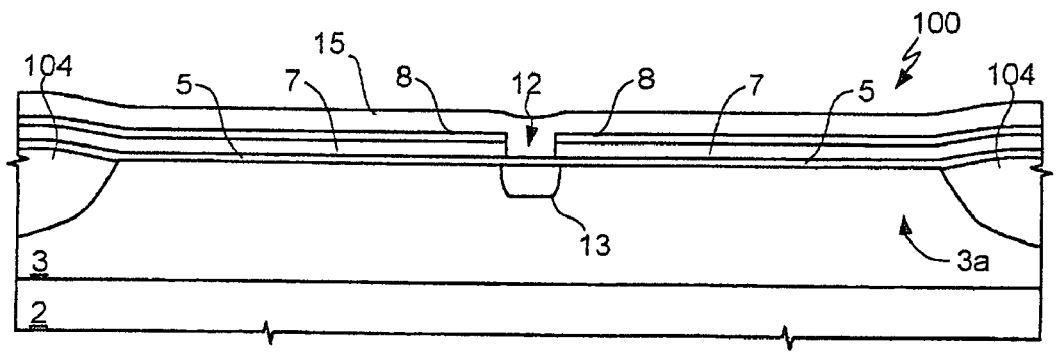
FIGS. 16-18 show different cross sections of the semiconductor wafer of FIGS. 14 and 15 in subsequent manufacturing steps.

After removing the hard mask 101, the process proceeds as already described until the dielectric filling layer 15 is deposited, which fills the enrichment opening 12 above the enriched region 13. The structure of FIG. 16 is thus obtained.

Figure 17:
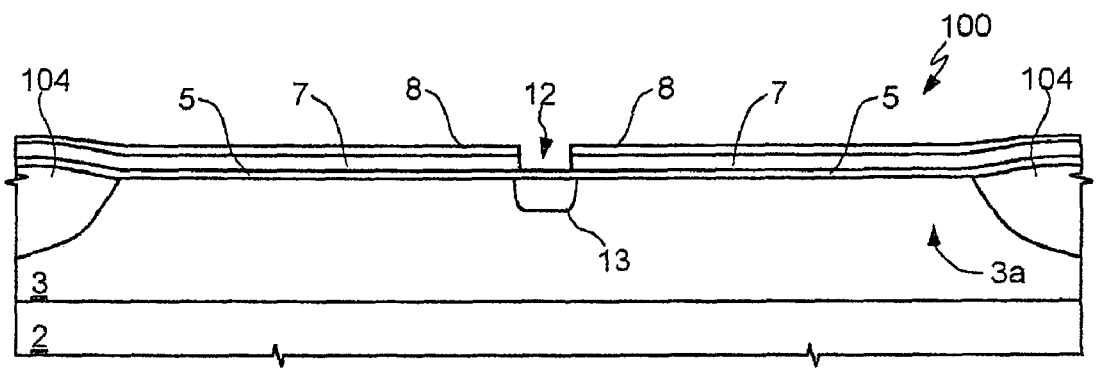

The wafer 100 is then planarized by CMP, as illustrated in FIG. 17. In this case, since the recessed field-oxide regions 104 determine only slight irregularities on the surface of the wafer 100, CMP planarization is as a rule sufficient to eliminate the portion of the dielectric filling layer 15 that exceeds the enrichment opening 12. A specific etching step for eliminating residue, prior to removal of the sacrificial layer 8 may, therefore, be unnecessary.

Figure 18:
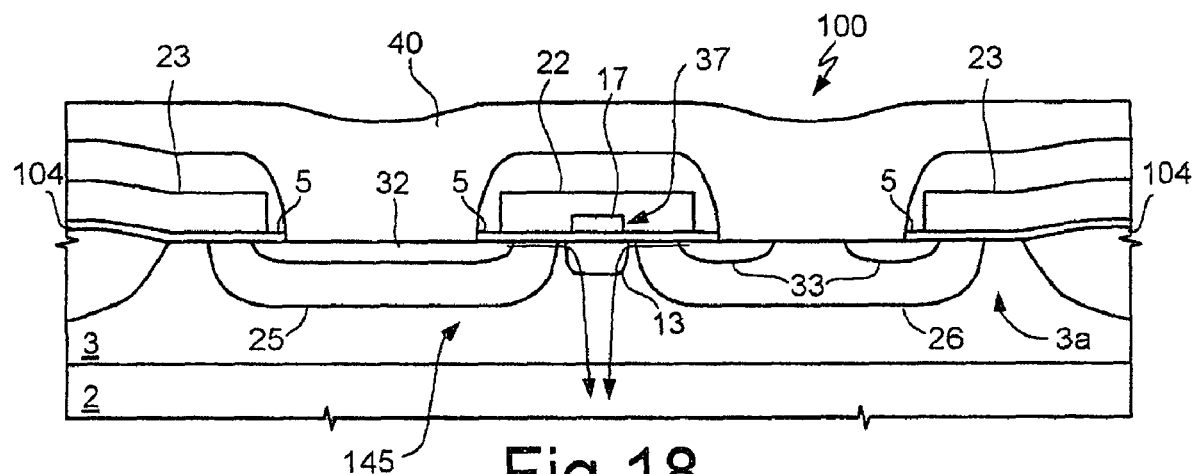
Figure 19:
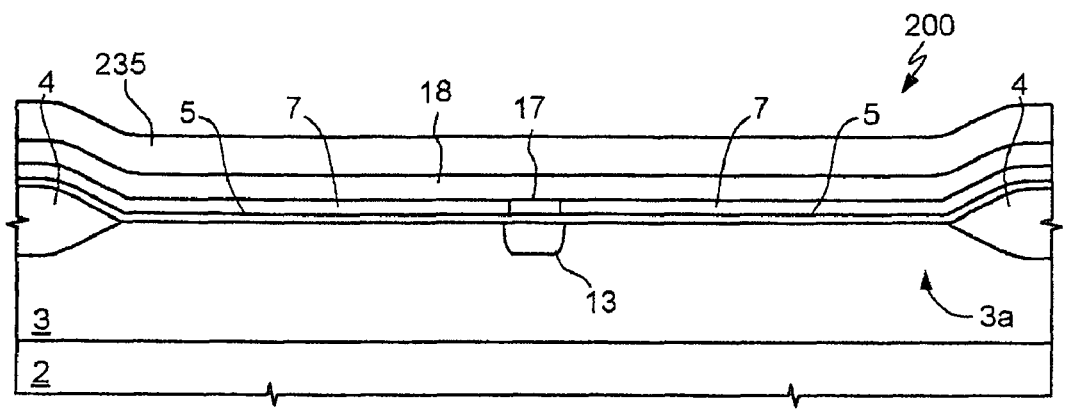
FIGS. 19-23 show cross sections through a semiconductor wafer in successive steps of a process for manufacturing a MISFET device in accordance with a third embodiment of the present invention.

The process is continued and terminated as already described with reference to FIGS. 8-13. A VDMOS transistor 145 is thus obtained, as illustrated in FIG. 18.

FIGS. 19-23, in which parts that are the same as those already illustrated are designated by the same reference numbers, show a third embodiment of the invention. In this case, a wafer 200 is subjected to initial manufacturing steps, as already described with reference to FIGS. 1-9, up to deposition of the second polysilicon layer 18.

Figure 20:
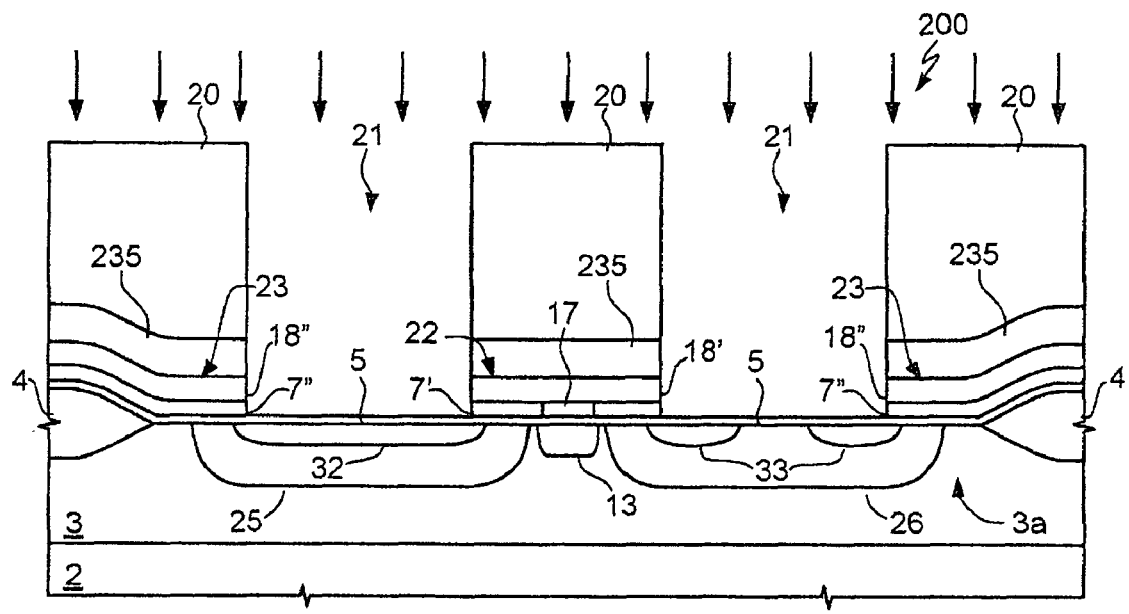

Then, the wafer 200 is coated with a protective dielectric layer 235 (FIG. 19), for example of silicon oxide, before the gate mask 20 is formed. The protective dielectric layer 235, the second polysilicon layer 18, and the first polysilicon layer 7 are etched in sequence using the same gate mask 20 to define the first gate electrode 22 and the second gate electrodes 23 (FIG. 20).

Figure 21:
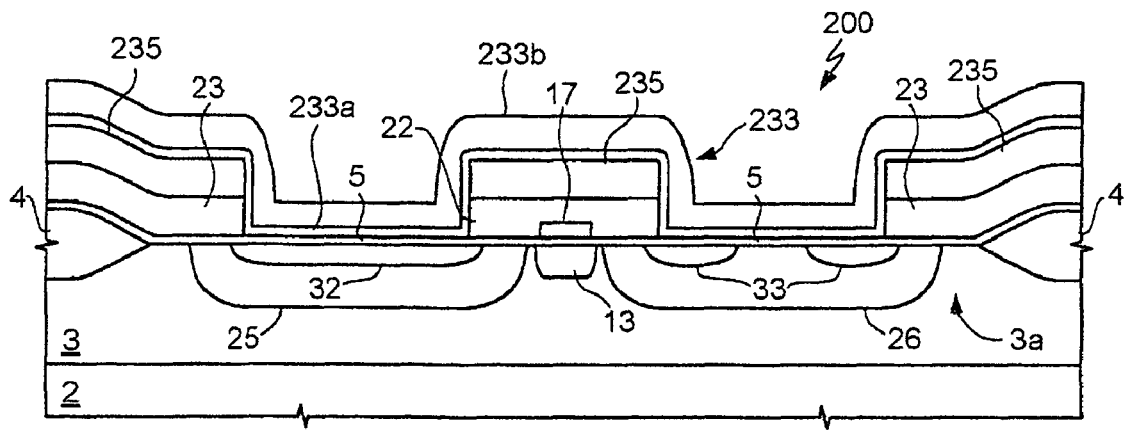
Figure 22:
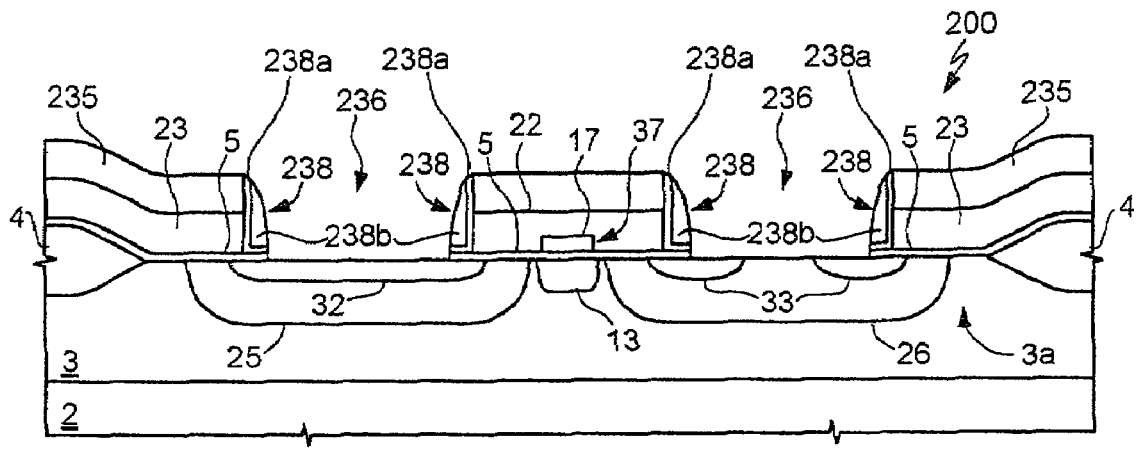

After formation of the body regions 25, 26 and the source regions 32 and 33 and removal of the gate mask 20, the wafer 200 is coated with an insulating structure 233, as illustrated in FIG. 21. The insulating structure 233 has a thickness such as to incorporate the first gate electrode 22 and the second gate electrodes 23 and comprises, for example, a thin silicon-nitride layer 233a (e.g., approximately 10-100 nm) and a thicker silicon-oxide layer 233b (e.g., approximately 100-600 nm). The silicon-nitride layer 233a has the function of blocking possible hydrogenated ions generated during stress in a wet environment, so improving the reliability of the device produced. Alternatively, the insulating structure 233 may comprise a single silicon-oxide layer.

Figure 23:
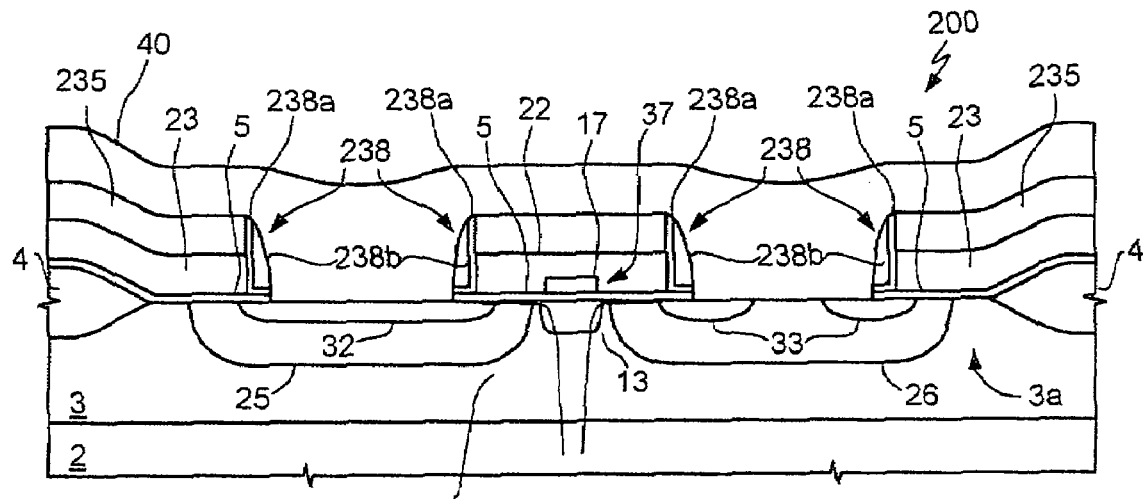

Without any need to use a mask, the insulating layer 235 and the dielectric gate layer 5 are etched by anisotropic etch to form source windows 236 (FIG. 22), which uncover partially the first source region 32 and the second source regions 33, as well as part of the second body region 26. The insulating layer 233 is removed by the anisotropic etch, except on the free sides of the gate electrodes 22, 23, where spacers 238 are formed, which provide lateral insulation and comprise first portions 238a of silicon nitride and second portions 238b of silicon oxide. The manufacturing process is then completed with steps of metallization, in which source contacts 40 are made, as well as gate and drain contacts (not illustrated herein). A VDMOS transistor 245 is thus obtained, the structure of which is illustrated in FIG. 23.

Figure 24:
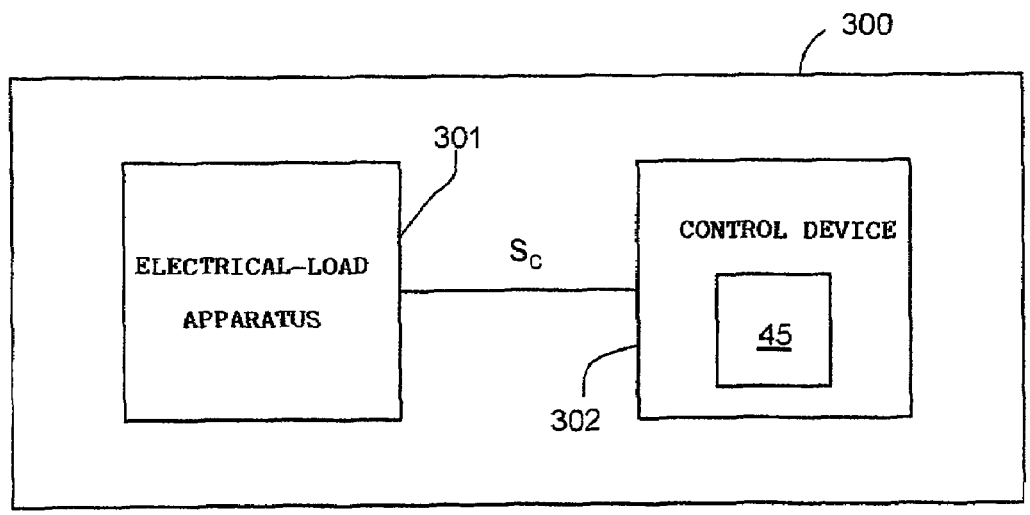
FIG. 24 is a system representation of an embodiment of the invention.

FIG. 24 is a schematic illustration of an electrical-load system 300, which comprises an electrical-load apparatus 301 and a control device 302 coupled thereto for issuing control signals $S_C$. The apparatus 301 and/or the control device 302 comprises a circuit equipped with one or more examples of the VDMOS transistor 45 of FIG. 13 (or, alternatively, of the VDMOS transistor 145 of FIG. 18 or of the VDMOS transistor 245 of FIG. 23). The electrical-load system 300 and the electrical-load apparatus 301 may, for example, be a DC-DC converter system, with a resistive or inductive load or a motor-control system with an inductive load.

Finally, it is evident that modifications and variations may be made to the process and to the device described herein, without thereby departing from the spirit and scope of the present invention.

In particular, the process may be used for providing MISFET devices different from VDMOS transistors. In one embodiment, for example, an IGBT can be produced.

What is claimed is:

1. A vertical MISFET device comprising:
   a semiconductor layer having a first type of conductivity and a first level of doping;
   at least a first body region and a second body region, housed in the semiconductor layer and having a second type of conductivity, opposite to the first type of conductivity;
   an enriched region, arranged in the semiconductor layer between the first body region and the second body region, the enriched region having the first type of conductivity and a second level of doping, higher than the first level of doping;
   a gate electrode extending over the enriched region, over part of the first body region, and over part of the second body region; and
   a dielectric gate structure, arranged between the gate electrode and the semiconductor layer, the dielectric gate structure having a larger thickness on the enriched region and a smaller thickness on the first body region and the second body region;
   wherein the dielectric gate structure comprises a thick dielectric gate region, and in that the gate electrode has a smaller thickness on the thick dielectric gate region and a greater thickness outside the thick dielectric gate region.

2. The device according to claim 1, wherein walls of the thick dielectric gate region form an angle greater than 70° with a surface of the semiconductor layer.

3. The device according to claim 1, comprising a metal source contact, extending over the gate electrode, and wherein the gate electrode is electrically insulated from the metal source layer at the top by an insulating layer in the top part and laterally by spacers.

4. The device according to claim 3, wherein the spacers comprise first portions of silicon nitride and second portions of silicon oxide.

5. An electrical-load system comprising an electrical-load apparatus and a control device coupled to the electrical-load apparatus, wherein the control device comprises a vertical MISFET device according to claim 1.

6. An electronic device, comprising:
   a semiconductor layer having a first level of a first conductivity;
   a first body region disposed in the semiconductor layer and having a second conductivity;
   an adjust region disposed in the semiconductor layer not contiguous with the first body region and having a second level of the first conductivity; and
   a gate insulator disposed over the semiconductor layer on a first plane and having a first thickness over the first body region and having a second thickness that extends further beyond the first plane than the first thickness over the adjust region.

7. The device of claim 6, further comprising:
   a substrate having the first conductivity; and
   wherein the semiconductor layer comprises an epitaxial layer disposed over the substrate.

8. The device of claim 6 wherein:
the adjust region is separated from the body region by a separation region of the semiconductor layer; and
the gate insulator is disposed over the separation region.

9. The device of claim 6 wherein:
the adjust region is separated from the body region by a separation region of the semiconductor layer; and
the gate insulator is disposed over the separation region and has substantially the first thickness over the separation region.

10. The device of claim 6 wherein the second level of the first conductivity is greater than the first level of the first conductivity.

11. The device of claim 6 wherein the second thickness of the gate insulator is greater than the first thickness of the gate insulator.

12. The device of claim 6, further comprising a source region disposed in the body region and having the first conductivity.

13. The device of claim 12 wherein the gate insulator is disposed over the source region.

14. The device of claim 6, further comprising a gate disposed over the gate insulator.

15. The electronic device of claim 6, further comprising:
a second body region disposed in the semiconductor layer and having the second conductivity; and
wherein the gate insulator is disposed over the second body region and has substantially the first thickness over the second body region.

16. The device of claim 14, further comprising a source region disposed in the second body region and having the first conductivity.

17. The electronic device of claim 6, further comprising a gate electrode extending over the adjust region and over part of the first body region and having a smaller thickness over the adjust region and a greater thickness outside the adjust region.

18. The electronic device of claim 6, wherein the gate insulator comprises a dielectric gate region, and further comprises a larger thickness over the adjust region and a smaller thickness over the first body region.

19. The electronic device of claim 6, further comprising a second body region disposed in the semiconductor layer; and
wherein the adjust region is disposed substantially equidistant between the first and second body regions.

20. The electronic device of claim 6, wherein the adjust region comprises a thickness that is greater than the thickness of the first body region.

21. The electronic device of claim 6, wherein the adjust region is disposed on a central axis of the gate insulator.

22. An integrated circuit, comprising:
an electronic device including
a semiconductor layer having a first level of a first conductivity,
a first body region disposed in the semiconductor layer and having a second conductivity,
an adjust region disposed in the semiconductor layer without contacting the first body region and having a second level of the first conductivity, and
a gate insulator disposed over the semiconductor layer and having a first thickness over the first body region and having a second thickness over the adjust region wherein the portion of the semiconductor layer disposed under the gate insulator comprises a uniform thickness.

23. The integrated circuit of claim 22 wherein the electronic device comprises a transistor.

24. A system, comprising:
a first integrated circuit including
an electronic device including
a semiconductor layer having a first level of a first conductivity,
a first body region disposed in the semiconductor layer and having a second conductivity,
an adjust region disposed in the semiconductor layer and having a second level of the first conductivity, and
a gate insulator having a first portion and a second portion, the gate insulator disposed over the semiconductor layer such that the first portion comprises a first thickness and is substantially disposed over the body region and such that the second portion comprises a second thickness and is substantially disposed over the adjust region, wherein the portion of the semiconductor layer disposed under the gate insulator comprises a uniform thickness; and
a second integrated circuit coupled to the first integrated circuit.

25. The system of claim 24 wherein the first and second integrated circuits are disposed on a same die.

26. The system of claim 24 wherein the first and second integrated circuits are disposed on respective dies.

27. The system of claim 24 wherein the second integrated circuit comprises a controller.

28. The system of claim 24, further comprising a load coupled to the electronic device.

* * * * *